United States Patent [19]

Kamayachi et al.

[11] Patent Number: 4,943,516

[45] Date of Patent: Jul. 24, 1990

[54] PHOTOSENSITIVE THERMOSETTING RESIN COMPOSITION AND METHOD OF FORMING SOLDER RESIST PATTERN BY USE THEREOF

[75] Inventors: Yuichi Kamayachi; Kenji Sawazaki; Morio Suzuki; Shoji Inagaki, all of Saitama, Japan

[73] Assignee: Taiyo Ink Manufacturing Co., Ltd., Tokyo, Japan

[21] Appl. No.: 274,966

[22] Filed: Nov. 22, 1988

[30] Foreign Application Priority Data

Nov. 30, 1987 [JP] Japan .................. 62-299967

[51] Int. Cl.$^5$ .................. G03F 7/027; G03C 1/72
[52] U.S. Cl. .................. 430/280; 430/287; 430/286; 430/288; 430/281; 430/271; 430/313; 430/325; 430/330; 522/103; 522/26; 528/113; 427/43.1; 427/177
[58] Field of Search .................. 430/288, 286, 287, 916, 430/284, 280, 281, 325, 330; 522/100

[56] References Cited

U.S. PATENT DOCUMENTS

| | | | |
|---|---|---|---|
| 3,989,610 | 11/1976 | Tsukada et al. | 430/288 |
| 4,105,518 | 8/1978 | McGinniss . | |
| 4,162,274 | 7/1979 | Rosenkranz . | |
| 4,216,246 | 8/1980 | Iwasaki et al. | 430/281 |
| 4,358,477 | 11/1982 | Noomen et al. . | |
| 4,428,807 | 1/1931 | Lee et al. . | |
| 4,479,983 | 10/1984 | Appelt et al. | 522/130 |

FOREIGN PATENT DOCUMENTS

| | | |
|---|---|---|
| 49-107333 | 10/1974 | Japan . |
| 51-14044 | 5/1976 | Japan . |
| 57-55914 | 4/1982 | Japan . |
| 60-208377 | 10/1985 | Japan . |
| 61-272 | 1/1986 | Japan . |
| 61-48800 | 10/1986 | Japan . |
| 61-243869 | 10/1986 | Japan . |
| 2032939A | 3/1981 | United Kingdom . |

*Primary Examiner*—Paul R. Michl
*Assistant Examiner*—John S. Y. Chu
*Attorney, Agent, or Firm*—Ronald P. Kananen

[57] ABSTRACT

A photosensitive thermosetting resin composition, comprising (A) a photosensitive prepolymer containing at least two ethylenically unsaturated bonds in the molecular unit thereof, (B) a photoinitiator, (C) a photopolymerizable vinyl monomer and/or an organic solvent as a diluent, (D) a finely powdered epoxy compound containing at least two epoxy groups in the molecular unit thereof and exhibiting sparing solubility in the diluent to be used, and optionally (E) a curing agent for epoxy resin, excels in developing property and sensitivity and enjoys a long shelf life.

By subjecting this photosensitive thermosetting resin composition to coating, exposure, development, and postcuring, there can be formed a solder resist pattern which excels in adhesion, insulation resistance, resistance to electrolytic corrosion, resistance to soldering temperature, resistance to chemicals, and resistance to plating.

28 Claims, No Drawings

PHOTOSENSITIVE THERMOSETTING RESIN COMPOSITION AND METHOD OF FORMING SOLDER RESIST PATTERN BY USE THEREOF

BACKGROUND OF THE INVENTION

1. Field of the Invention:

This invention relates to a photosensitive thermosetting resin composition and a method of forming a solder resist pattern by the use thereof, and more particularly relates to a novel photosensitive thermosetting resin composition useful as metarials for the production of printed circuit boards, the precision fabrication of metallic articles, the etching of glass and stone articles, the relief of plastic articles, and the preparation of printing plates and particularly useful as a solder resist for printed circuit boards and to a method of forming a solder resist pattern by the steps of exposing a layer of the resin composition selectively to an actinic ray through a photomask having a pattern and developing the unexposed part of the layer.

2. Description of the Prior Art:

The solder resist is a substance which is used during the soldering of a given part to a printed circuit board for the purpose of preventing molten solder from adhering to irrelevant portions and protecting circuits. It is, therefore, required to possess such properties as high adhesion, insulation resistance, resistance to soldering temperature, resistance to solvents, resistance to alkalis, resistance to acids, and resistance to plating.

The solder resist in the early stage of popular use was preponderantly of the epoxy melamine-based thermosetting type. The epoxy melamine solder resist betrayed deficiency in resistance to soldering temperature, resistance to chemicals, and resistance to plating. For use in the production of industrial-use printed circuit boards, epoxy-based thermosetting type solder resists have been disclosed in the specification of Japanese Patent Publication No. SHO 51(1976)-14,044, for example, as improved versions of the early solder resist mentioned above. At present, they are prevailing over those of other types. For use in the production of consumer-use printed circuit boards, since productivity dictates the dominant consideration, such rapid-setting ultraviolet setting type solder resists as disclosed in the specification of Japanese Patent Publication No. SHO 61(1986)-48,800 are prevailing now. The ultraviolet setting type solder resists, however, cannot be used in the production of industrial-use printed circuit boards because they pose a problem as to the setting property in the bottom of a thick film and betray deficiency in resistance to heat. These solder resists rely on the screen printing method for the formation of a solder resist pattern. In the formation of solder resist pattern which are expected to follow the recent trend of electronic equipments and devices toward reduction in weight and volume and the consequent trend of printed circuit boards toward increased density of integration and the trend of the industry toward adoption of the practice of mounting component parts on the surface of a printed circuit board, the ultraviolet curing type solder resists are disadvantageous in staining a pattern by bleeding and skipping between adjacent conductors and, therefore, are no longer capable of fulfiling the function expected of a solder resist film.

For the solution of these problems, dry film-type photo-solder resists and liquid photo-solder resists have been developed. As a dry film-type photo-solder resist, a dry film-producing photosensitive resin composition comprising a urethane-di(meth)acrylate, a linear polymer possessing a specific glass transition point, and a sensitizer is disclosed in the specification of Japanese Patent Application laid open to public inspection, KOKAI (Early Publication) No. SHO 57(1982)-55,914. When such dry film-type photo-solder resists are used in high-density printed circuit boards, however, they are deficient in resistance to soldering temperature and in adhesion.

As aliquid photo-solder resist, a photopolymerizing coating composition comprising a solid or semisolid reaction product of polyepoxide and an ethylenically unsaturated carboxylic acid, an inert inorganic filler, a photopolymerization initiator, and a volatile organic solvent is disclosed in British Patent Application Early Publication No. GB-2,032,939A. Since this composition uses only an ultraviolet curing component and has no use for a thermosetting component, it is deficient in adhesion to a printed circuit board, resistance to soldering temperature, and insulation resistance. As a version which pays due consideration to the thermosetting property in question, a solder resist ink-quality resin composition comprising the reaction product of a phenol-novolak type epoxy resin with an unsaturated monobasic acid, the partial reaction product of a cresol-novolak type epoxy resin with an unsaturated monobasic acid, an organic solvent, a photopolymerization initiator, and an amine type curing agent is disclosed in the specification of Japanese Patent Application KOKAI No. SHO 60(1985)-208,377. This composition is intended to utilize additionally the phenomenon of thermal setting by allowing an epoxy group to remain in the molecular unit. Since this retention of the epoxy group results in a partial decrease of the photosensitive group, the composition suffers from a decline in the ability to cure itself upon exposure to the ultraviolet light. Since the composition does not permit ample retention of the epoxy group, it is incapable of exhibiting fully satisfactory properties expected of a solder resist.

As versions which involve additional use of an epoxy resin, a photosensitive composition comprising an unsaturated compound containing at least two terminal ethylene groups, a polymerization initiator, a compound containing at least two epoxy groups, and a compound containing at least two carboxyl groups is disclosed in the specification of Japanese Patent Application KOKAI No. SHO 49(1974)-107,333 and an ink composition comprising a photosensitive prepolymer obtained by causing the reaction product of a novolak type epoxy compound and an unsaturated monocarboxylic acid to react with the reaction product of a diisocyanate and a polyfunctional (meth) acrylate containing one hydroxyl group in the molecular unit thereof, a photoinitiator, and an organic solvent in addition to an epoxy resin is disclosed in the specification of Japanese Patent Application KOKAI No. SHO 61(1986)-272. While the latter composition exhibits to a certain extent properties expected of a solder resist, the former composition is inferior in resistance to soldering temperature and resistance to solvents because it is based on a (meth)-acryl group-containing acryl type linear polymer. These compositions are both of such quality that when their epoxy resin contents are increased, their photosetting property or so-called sensitivity is degraded and their resistance in the exposed portion thereof to the action of a developing solution tends to decline even to a point where they no longer endure protracted development and tend to induce incomplete development of an unexposed part. A resist ink composition comprising a photosetting resin obtained by the reaction of a saturated or unsaturated polybasic acid anhydride with the reaction product of a novolak type epoxy compound and an unsaturated monocarboxylic acid, a photoinitiator, and a diluent in addition to an epoxy resin is disclosed in the specification of Japanese Patent Application KOKAI No. SHO 61(1986)-243,869. This composition requires use of an aqueous alkali solution as its developing solution. Therefore, if the content of epoxy resin possessing no solubility in the aqueous alkali solution is increased, the composition similarly suffers from degradation of its sensitivity and decline of its solubility of the unexposed portion in the developing solution to a point where the unexposed portion remains undeveloped and the development is required to be performed for an unduly long time and the exposed portion is corroded by the developing solution.

BRIEF SUMMARY OF THE INVENTION

An object of this invention is to provide a photosensitive thermosetting resin composition which suffers from none of the various drawbacks mentioned above, excels in both developing property and sensitivity, enables an exposed pert thereof to withstand the developing solution, and enjoys a long pot life.

Another object of this invention is to provide a photosensitive thermosetting resin composition which is capable of producing a cured coating excelling in adhesion, insulation resistance, resistance to electrolytic corrosion, resistance to soldering temperature resistance to solvents, resistance to alkalis, resistance to acids, and resistance to plating besides the highly desirable properties mentioned above and which fits the production of consumer-use printed circuit boards and industrial-use printed circuit boards and a method for the formation of a solder resist pattern by the use of said resin composition.

To accomplish the objects described above, according to the present invention, there is provided a photosensitive thermosetting resin composition, comprising (A) a photosensitive prepolymer containing at least two ethylenically unsaturated bonds in the molecular unit thereof, (B) a photoinitiator, (C) a photopolymerizable vinyl monomer and/or an organic solvent as a diluent, and (D) a finely powdered epoxy compound containing at least two epoxy groups in the molecular unit thereof and exhibiting sparing solubility in the diluent to be used. The composition described above, when necessary, may incorporated therein a curing agent for epoxy resin.

Further, according to this invention, there is provided a method of forming a solder resist pattern on a printed circuit board, which method comprises applying on the surface of the printed circuit board a photosensitive thermosetting resin composition comprising (A) a photosensitive prepolymer containing at least two ethylenically unsaturated bonds in the molecular unit thereof, (B) a photoinitiator, (C) a photopolymerizable vinyl monomer and/or an organic solvent as a diluent, (D) a finely powdered epoxy compound containing at least two epoxy groups in the molecular unit thereof and exhibiting sparing solubility in the diluent to be used, and optionally (E) a curing agent for epoxy resin, exposing the applied layer of the composition selectively to an actinic ray through a photomask having a given pattern, developing the unexposed portion of the applied layer with a developing solution thereby giving rise to a resist pattern, and thereafter thermally setting the finely powdered epoxy compound by application of heat.

DETAILED DESCRIPTION OF THE INVENTION

In the case of solder resist quality photosensitive thermosetting resin compositions using an epoxy resin as a thermosetting component in combination with a photosensitive prepolymer, it has been customary to employ an epoxy resin of the kind solution in an organic solvent. When a photosensitive thermosetting resin composition is prepared by using an epoxy resin of this kind, it is presumed that the epoxy resin is dissolved therein as intertwined with the photosensitive prepolymer (with the chain-length portions of the resins held in intertwined state). When a composition using a photosensitive prepolymer soluble in an aqueous alkali solution is developed with an aqueous alkali solution, for example, since the epoxy resin is generally insoluble in an aqueous alkali solution and it is held as intertwined with the photosensitive prepolymer, the photosensitive prepolymer in the unexposed portion suffers from loss of solubility. Further, since the epoxy resin is dissolved in the composition, the epoxy resin reacts unduly rapidly with the curing agent which is liable to induce the socalled heat fogging, a phenomenon that incomplete development occurs during the courses of development. Therefore the composition acquires an inferior developing property. When a composition using a photosensitive prepolymer soluble in the organic solvent used for the development is developed with an organic solvent, the composition tends to induce the same heat fogging and suffers from a decline of developing property in spite of the solubility of the epoxy resin in the solvent. Further in the exposed portion, the coating tends to be corroded and suffers from impairment of sensitivity because the photosensitive prepolymer permits no enhancement of cross-linking density owing to the presence of the epoxy resin and dissolves into the developing solution (organic solvent). In said either case the shelf life of the composition becomes short, since the reaction of the epoxy resin with the curing agent is rapid as mentioned above.

When the composition using a water-soluble epoxy resin is developed with an aqueous alkali solution, since the epoxy resin is soluble in the developing solution, the exposed part tends to be corroded by the developing solution (aqueous alkali solution) and suffers from impairment of sensitivity.

In contrast, when the composition uses a finely powdered epoxy compound (resin) sparingly soluble in a diluent used in the composition as in the case of the composition of the present invention, the photosensitive prepolymer assumes a state of enveloping the particles of the epoxy compound. When the composition using a photosensitive prepolymer soluble in an aqueous alkali solution is developed with an aqueous alkali solution, since the epoxy compound does not impair the solubility of the photosensitive prepolymer and further since the epoxy compound is sparingly soluble in the diluent to be used, the composition exhibits low reactivity with the curing agent for epoxy resin and does not easily induce the phenomenon of heat fogging and enjoys a satisfactory developing property. When a composition using a photosensitive prepolymer soluble in the organic solvent to be used for development, the organic solvent as a diluent, and a finely powdered epoxy compound sparingly soluble in the organic solvent is developed with an organic solvent, since the epoxy compound is sparingly soluble in the organic solvent mentioned above, the exposed portion is not easily corroded by the developing solution (organic solvent) and induces no decline of sensitivity. The developing property of the unexposed portion is satisfactory because the epoxy compound is in the form of a fine particle and, therefore, is incapable of lowering the solubility of the photosensitive prepolymer and unliable to induce the phenomenon of heat fogging. Furthermore, in said either case the shelf life of the composition becomes long, since the reactivity of the epoxy compound with the curing agent is low as mentioned above.

In short, the salient feature of the photosensitive thermosetting resin composition of the present invention resides in the fact that the "finely powdered" epoxy compound sparingly soluble in the diluent "to be used" is employed as a thermosetting component. The finely powdered (fine particulate) epoxy compound which is an essential component is sparingly soluble in the diluent to be used and is intended to be used as dispersed in the finely powdered form, i.e., in the same manner as a filler. The composition, therefore, is neither corroded by the developing solution nor suffered to entail any decline of sensitivity. Further, since the finely powdered epoxy compound in the unexposed portion is washed away by the developing solution during the course of the development, the composition so excels in developing property as to be developed in a short span of time. Owing to the subsequent application of heat, the epoxy compound is enabled to be melted and thermoset in itself or to be copolymerized with the photosensitive prepolymer. As the result, a solder resist pattern for a printed circuit board possessing various highly desirable properties can be produced. As is plain from the description of the function given above, the term "sparingly soluble" as used in the present specification refers to the concept of exhibiting not only the insolubility in the diluent to be used but also the meager solubility capable of manifesting the function described above.

Now, the constituent components of the photosensitive thermosetting resin composition of the present invention will be described one by one below.

The photosensitive prepolymers (A) possessing at least two ethylenically unsaturated bonds in the molecular unit thereof may be, for example, (a-1) complete esterification products of a novolak type epoxy compound with an unsaturated monocarboxylic acid, (a-1-1) reaction products obtained by causing the secondary hydroxyl group of said complete esterification product (a-1) to react with a saturated or unsaturated polybasic acid anhydride, (a-1-2) reaction products obtained by causing the secondary hydroxyl group of said complete esterification product (a-1) to react with a (meth)acrylate possesssing one hydroxyl group in the molecular unit thereof through the medium of a diisocyanate; (a-2) partial esterification products of the novolak type epoxy compound with an unsaturated monocarboxylic acid, (a-2-1) reaction products obtained by causing the secondary hydroxyl group of said partial esterification product (a-2) to react with a saturated or unsaturated polybasic acid anhydride, (a-2-2) reaction products obtained by causing the secondary hydroxyl group of said partial esterification product (a-2) to react with a (meth)acrylate possessing one hydroxyl group in the molecular unit through the medium of a diisocyanate; (b-1) complete etherification products of the novolak type epoxy compound with an unsaturated phenol compound, (b-1-1) reaction products obtained by causing the secondary hydroxyl group of said complete etherification product (b-1) to react with a saturated or unsaturated polybasic acid anhydride, (b-1-2) reaction products obtained by causing the secondary hydroxyl group of said complete etherification product (b-1) to react with a (meth)acrylate possessing one hydroxyl group in the molecular unit thereof through the medium of a diisocyanate; (b-2) partial etherification product of the novolak type epocy compound with an unsaturated phenol compound, (b-2-1) reaction products obtained by causing the secondary hydroxyl group of said partial etherification product (b-2) to react with a saturated or unsaturated polybasic acid anhydride, (b-2-2) reaction product obtained by causing the secondary hydroxyl group of said partial etherification product (b-2) to react with a (meth)acrylate possessing one hydroxyl group in the molecular unit thereof through the medium of a diisocyanate; and/or (c) such allyl compounds as (c-1) diallyl phthalate prepolymers and/or (c-2) diallyl isophthalate prepolymers. When the photosensitive prepolymer (A) is solid or semisolid at ambient temperature, it can be used indiscriminately whether the exposure is made in a contacting manner or off-contacting manner. When it is liquid at ambient temperature, it is used exclusively where the exposure is made in an off-contacting manner. As the photosensitive prepolymer (A), at least one prepolymer selected from the various prepolymers mentioned above, depending on the particular manner of exposure to be employed, is used.

As the novolak type epoxy compounds described above, those which are obtained by the reaction of epichlorohydrin and/or methyl epichlorohydrin with novolaks resulting from the reaction of such phenols as phenol, cresol, halogenated phenol, and alkylphenol with formaldehyde in the presence of an acidic catalyst are particularly suitable. As concrete examples of such suitable novolak type epoxy compounds, the products of Tohto Kasei Co., Ltd. marketed under registered trademark designation of "Epo Tohto" YDCN-701, YDCN-704, YDPN-638, and YDPN-602; those of The Dow Chemical Company marketed under registered trademark designation of "D.E.N"-431 and -439; those of Ciba-Geigy Ltd. marketed under registered trademark designation of "ARALDITE" EPN-1138, -1235, and -1299; those of Dainippon Ink and Chemcials, Inc. marketed under registered trademark designation of "EPICLON" N-730, -770, -865, -665, -673, and -695, and registered trademark designation of "PLYOPHEN" VH-4150, -4240, and -4440; those of Nippon Kayaku Co., Ltd. marketed under registered trademark designation of "EOCN" -120 and -104 and registered trademark designation of "BRRN"-1020; and those of Asahi Chemcial Industry Co., Ltd. marketed under registered trademark designation of "AER" ECN-265, -293, -285, and -299 may be cited. Optionally the novolak type epoxy compounds may be partially or wholly substituted with such bisphenol A type, bisphenol F type, hydrogenated bisphenol A type, brominated bisphenol A type, amino group-containing, alicyclic, or polybutadienemodified glycidyl ether epoxy compounds as the products of Yuka Shell Epoxy Kabushiki Kaisha marketed under registered trademark designation of "EPIKOTE"-828, -1007, and -807; those of Dainippon Ink and Chemicals, Inc. marketed under registered trademark designation of "EPICLON"-840, -860, -3050, and -830; those of The Dow Chemcial Company marketed under registered trademark designation of "D.E.R"-330, -337, and -361; those of Daicel Chemical Industries, Ltd. marketed under registered trademark designation of "Celloxide" 2021 and 3000; those of Mitsubishi Gas Chemical Company, Inc. marketed udner registered trademark designation of "TETRAD"-X and -C; those of Nippon Soda Co., Ltd. marketed under registered trademark designation of "NISSO EPOXYN" EPB-13 and -27; Tohto Kasei Co., Ltd. marketed under registered trademark designation of "Epo Tohto" YD-116, -128, -013, and -020, YDG-414, and YDF-190, -2004, and -2007 and registered trademark designation of "Sun Tohto" ST-3000 and -110; those of Ciba-Geigy Ltd. marketed under registered trademark designation of "ARALDITE" GY-260 and -255 and XB-2615; and those of The Dow Chemical Company marketed under registered trademark designation of "D.E.R" -332, -662, and -542 may be cited. For use in the solder resist for the printed circuit board, cresol novolak type epoxy compounds are particularly desirable.

The unsaturated monocarboxylic acids as described above may be, for example, acrylic acid, methacrylic acid, $\beta$-styryl acrylic acid, $\beta$-furfuryl acrylic acid, crotonic acid, $\alpha$-cyanocinnamic acid, cinnamic acid, half esters of saturated or unsaturated dibasic acid anhydrides with (meth)acrylates possessing one hydroxyl group in the molecular unit thereof, such as, for example, half esters obtained by causing such saturated or unsaturated dibasic acid anhydrides of phthalic acid, tetrahydrophthalic acid, hexahydrophthalic acid, maleic acid, succinic acid, itaconic acid, chlorendic acid, methylhexahydrophthalic acid, methylendomethylene tetrahydrophthalic acid, and methyltetrahydrophthalic acid to react in an equimolar ratio with hydroxyethyl acrylate, hydroxypropyl acrylate, hydroxybutyl acrylate, polyethylene glycol monoacrylate, glycerin diacrylate, trimethylol propane diacrylate, pentaerythritol triacryalte, dipentaerythritol pentaacrylate, and diacrylate of triglycidyl isocyanurate or with methacrylates corresponding to the acrylates enumerated above, and half esters of saturated or unsaturated dibasic acid anhydrides with unsaturated monoglycidyl compounds obtained by causing the saturated or unsaturated dibasic acids mentioned above to react similarly with glycidyl (meth)acrylate by the conventional method. These are used either singly or in the form of a mixture of two or more members. Among other unsaturated monocarboxylic acids mentioned above, acrylic acid is particularly desirable.

The saturated or unsaturated polybasic acid anhydrides as described above may be, for example, the anhydrides of phthalic acid, tetrahydrophthalic acid, hexahydrophthalic acid, maleic acid, succinic acid, itaconic acid, chlorendic acid, methylhexahydrophthalic acid, methylendomethylenete-tetrahydrophthalic acid, methyltetrahydrophthalic acid, trimellitic acid, pyromellitic acid, and benzophenone tetracarboxylic acid. Among other anhydrides mentioned above, tetrahydrophthalic acid anhydride or hexahydrophthalic acid anhydride is particularly desirable.

The diisocyanates as described above include tolylene diisocyanate, xylylene diisocyanate, hydrogenated xylylene diisocyanate, hexamethylene diisocyanate, isophorone diisocyanate, diphenyl methane diisocyanate, toluidine diisocyanate, and lysine diisocyanate, for example. Among other diisocyanates mentioned above, tolylene diisocyanate or isophorone diisocyanate is particularly desirable.

The (meth)acrylates possessing one hydroxyl group in the molecular unit thereof as described above include hydroxyethyl acrylate, hydroxypropyl acrylate, hydroxybutyl acrylate, polyethylene glycol monoacrylate, glycerin diacrylate, trimethylol propane diacrylate, pentaerythritol triacrylate, dipentaerythritol pentaacrylate, and diacrylate of tris(hydroxyethyl)isocyanurate, and methacrylates corresponding to the acrylates enumerated above, for example. Among other (meth)acrylates mentioned above, hydroxyethyl acrylate or pentaerythritol triacrylate is used particularly desirably.

The unsaturated phenol compounds as described above include 4'-hydroxychalcone, 2'-hydroxychalcone, and 4,4-dihydroxychalcone, for example. Particularly, 4'-hydroxychalcon is desirable.

Concrete examples of diallyl phthalate prepolymer or diallyl isophthalate prepolymer which is the allyl compound answering the description given above are the products of Daiso Co., Ltd. marketed under registered trademark designations of "DAISO DAP" and "DAISO ISODAP". These allyl compounds are desired to have an average molecular weight in the range of 2,000 to 30,000. Particularly, diallylisophthalate prepolymer having an average molecular weight in the range of 5,000 to 20,000 is desirable.

The complete esterification products (a-1), complete etherification products (b-1), partial esterification products (a-2), and partial etherification products (b-2) using the novolak type epoxy compounds and unsaturated monocarboxylic acids or unsaturated phenol compounds are obtained by relevant reactions following the conventional method, with the ratio of number of equivalents of epoxy group/number of equivalents of carboxyl group or the ratio of number of equivalents of epoxy group/number of equivalents of phenolic hydroxyl group fixed in the range of 0.8 to 3.3, preferably 0.9 to 1.1 in the case of the complete esterification products (a-1) and the complete etherification products (b-1) or 1.1 to 2.5 in the case of the partial esterification products (a-2) and the partial etherification products (b-2). If the ratio is less than 0.8, the products inevitably contain free acid or free phenol and consequently cause the corresponding compositions to suffer from a decline in resistance to soldering temperature. If the ratio exceeds 3.3, the compositions suffer from a decline in photosensitivity.

The reaction is accomplished, for example, dissolving a novolak type epoxy compound in an organic solvent such as cellosolve acetate, carbitol acetate, or ethylmethyl ketone and causing the resultant solution and an unsaturated monocarboxylic acid and/or an unsaturated phenol compound added thereto react with each other by being heated and stirred at a temperature in the range of 70° to 140° C. in the presence of a thermal polymerization inhibitor such as hydroquinone, catechol, or pyrogallol and a catalyst such as a tertiary amine like benzyl diethylamine or triethylamine or a quaternary ammonium salt like benzyltrimethyl ammonium chloride or benzyltriethyl ammonium bromide.

To produce said reaction products (a-1-1), (a-2-1), (b-1-1) and (b-2-1), the ratio of the secondary hydroxyl group of said total esterification products (a-1), total etherification products (b-1), partial esterification products (a-2), and partial etherification products (b-2) of novolak type epoxy compounds to the polybasic acid anhydride in the addition reaction is desired to be such that the ratio of number of equivalents of acid anhydride to number of equivalents of secondary hydroxyl group is not less than 0.3. The produced resins, therefore, are desired to have an acid value in the range of 30 to 160 mg KOH/g, preferably 45 to 120 mg KOH/g. When the reaction product thus obtained is used as a photosensitive prepolymer, the development can be attained with an alkaline developing solution. If the acid value is less than 30, the produced composition suffers from inferior solubility in the alkaline developing solution. Conversely, if the acid value exceeds 160, the various properties of the cured film such as resistance to alkalis and electrical properties fall short of the levels expected of a solder resist. When the products (a-1)through (b-2) have an unduly large residual epoxy group content, such residual epoxy groups are liable to gel during the reaction with a saturated or unsaturated polybasic acid anhydride. The residual epoxy group content properly is not more than 20%, preferably not more than 15%.

The product aimed at is obtained by selecting at least one species from the aforementioned resins (a-1) through (b-2) and at least one species from the aforementioned polybasic acid anhydrides, mixing the selected species, and heating and stirring them at a temperature in the range of 70° to 120° C. as generally practised.

The addition products (a-1-2), (a-2-2), (b-1-2), and (b-2-2) between the secondary hydroxyl group of the complete esterification products (a-1), complete etherification products (b-1), partial esterification producrs (a-2), and partial etherification products (b-2) of novolak type epoxy compounds mentioned above and (meth)-acrylates possessing one hydroxyl group in the molecular unit thereof through the medium of diisocyanates are obtained as follows. As the first step, the diisocyanate and the (meth)acrylate having one hydroxyl group in the molecular unit thereof are caused to react with each other in an equimolar ratio by being heated and stirred at a temperature in the range of 30° to 100° C. for a period in the range of 2 to 12 hours as generally practised, using or not using an organic solvent such as cellosolve acetate, carbitol acetate, or ethylmethyl ketone in the presence of a catalyst such as an organic tin compound like tributyl tin dilaurate or a tertiary amine like benzyldimethyl amine or triethyl amine, to effect synthesis of a half-urethane acrylate. In this case, the (meth)acrylate possessing one hydroxyl group in the molecular unit and the diisocyanate are desired to be used in amounts forming an equimolar ratio. Optionally, the (meth)acrylate may be used in an excess amount so that the excess thereof will be utilized per se as a reactive diluent. Then, the half-urethane (meth)acrylate obtained as described above is cooled to a temperature in the range of 25° to 35° C., mixed with at least one species selected from the aforementioned products (a-1) through (b-2) in relative amounts such that the ratio of number of equivalents of the isocyanate of the half-urethane (meth)acrylate to number of equivalents of the secondary hydroxyl group possessed by the selected species exceeds 0.1, desirably falls in the range of 0.1 to 1.0, preferably in the range of 0.2 to 0.9. Then, the resultant mixture is heated and stirred for reaction at a temperature in the range of 30° to 100° C. for a period in the range of 2 to 12 hours. If, in this case, the equivalent ratio is less than 0.1, the effect in heightening the setting property manifested on exposure to the actinic ray is not obtained.

Typical examples of the photoinitiator (B) are benzoins and benzoin alkyl ethers such as benzoin, benzyl, benzoin methyl ether, and benzoin isopropyl ether; acetophenones such as acetophenone, 2,2-dimethoxy-2-phenyl acetophenone, 2,2-diethoxy-2-phenyl acetophenone, 1,1-dichloroacetophenone, 1-hydroxycyclohexyl phenyl ketone, 2-methyl-1-[4-(methylthio)phenyl]-2-morpholino-propan-1-on, and N,N-dimethylaminoacetophenone; anthraquinones such as 2-methyl anthraquinone, 2-ethyl anthraquinone, 2-tert-butyl anthraquinone, 1-chloroanthraquinone, 2-amylanthraquinone, and 2-aminoanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone, methyl benzophenone, 4,4'-dichlorobenzophenone, 4,4'-bisdiethylaminobenzophenone, and Michler's ketone; and xanthones. They can be used either singly or in the form of a mixture of two or more members. Optionally, the photoinitiator (B) may be used in combination with one member or a mixture of two or more members selected from the conventional photosensitizers such as benzoic esters such as ethyl-4-dimethylaminobenzoate and 2-(dimethylamino)ethylbenzoate and tertiary amines such as triethyl amine and triethanol amine.

The amount of the photoinitiator (B) to be used is desired to fall in the range of 0.2 to 30 parts by weight, preferably 2 to 20 parts by weight, based on 100 parts by weight of the photosensitive prepolymer (A).

As the diluent (C), photopolymerizable vinyl monomers and/or an organic solvent can be used. Typical examples of the photopolymerizable vinyl monomers include hydroxyalkyl acrylates such as 2-hydroxyethyl acrylate and 2-hydroxybutyl acrylate; mono- and diacrylates of glycols such as ethylene glycol, methoxy tetraethyleneglycol, polyethylene glycol, and propylene glycol; acrylamides such as N,N-dimethyl acrylamide and N-methylol acrylamide; aminoalkyl acrylates such as N,N-dimethylaminoethyl acrylate; polyfunctional acrylates of polyhydric alcohols such as hexane diol, trimethylol propane, pentaerythritol, dipentaerythritol, and tris-hydroxyethyl isocyanurate and of ethylene oxide or propylene oxide adducts thereof; acrylates such as phenoxy acrylate, bisphenol A diacrylate, and ethylene oxide and propylene oxide adducts of such phenols; acrylates of glycidyl ether such as glycerin diglycidyl ether, trimethylol propane triglycidyl ether, and triglycidyl isocyanurate; and melamine acrylate; and/or methacrylates corresponding to the acrylates mentioned above.

The organic solvents usable effectively herein include ketones such as ethylmethyl ketone and cyclohexanone; aromatic hydrocarbons such as toluene, xylene, and tetramethyl benzene; glycol ethers such as methyl cellosolve, butyl cellosolve, methyl carbitol, butyl carbitol, propylene glycol monomethyl ether, dipropylene glycol monoethyl ether, and triethylene glycol monoethyl ether; esters such as ethyl acetate, butyl acetate, and acetic esters of the glycol ethers mentioned above; alcohols such as ethanol, propanol, ethylene glycol, and propylene glycol; aliphatic hydrocarbons such as octane and decane; and petrolic solvents such as petroleum ether, petroleum naphtha, hydrogenated petroleum naphtha, and solvent naphtha, for example. The organic solvent is desired to be highly compatible with the photosensitive prepolymer (A) and incapable of dissolving the finely powdered epoxy compound (D), both mentioned above.

The diluents (C) enumerated above can be used either singly or in the form of a mixture of two or more members. The amount of the diluent to be used is desired to fall in the range of 20 to 300 parts by weight, preferably 30 to 200 parts by weight, based on 100 parts by weight of the photosensitive prepolymer (A).

The diluent is used for the purpose of diluting the photosensitive prepolymer thereby imparting thereto a state permitting easy application and, at the same time, enhancing the photopolymerizing property of the prepolymer where a photopolymerizable vinyl monomer is used or for the purpose of dissolving and diluting the photosensitive prepolymer thereby enabling the prepolymer to be applied in the form of liquid where an organic solvent is used. The applied layer of the diluted photosensitive prepolymer is then dried to give rise to a coating. Depending on the particular kind of diluent to be employed, therefore, the exposure of the coating is effected by a method involving contact of the coating with the photomask or by a method not involving this contact. To be specific, the off-contact method is employed generally where a photopolymerizable vinyl monomer is used as a diluent, whereas the contact method is employed generally where an organic solvent or a mixture of the organic solvent with a photopolymeriable vinyl monomer is used as a diluent.

Then, as the finely powdered epoxy compound (D) possessing at least two epoxy groups in the molecular unit thereof, any of the epoxy compounds heretofore in popular use can be employed. This epoxy compound, however, is required to be capable of being dispersed in a finely powdered form in the photosensitive prepolymer (A) possessing at least two ethylenically unsaturated bonds in the molecular unit thereof and is further required to assume a solid or semisolid state at ambient temperature. It is also required to avoid dissolving in the photosensitive prepolymer (A) and the diluent (C) to be used and/or manifest solubility of the degree productive of no adverse effects upon photosensitivity and developing property. As desirable examples of the epoxy compound satisfying all these requirements, bisphenol S type epoxy resins represented by the product of Nippon Kayaku Co., Ltd. under registered trademark designation of "EBPS"-200, that of Asahi Denka Kogyo Co., Ltd. under registered trademark designation of "EPX"-30, and that of Dainippon Ink and Chemicals, Inc. under registered trademark designation of "EPICLON" EXA-1514; diglycidyl phthalates represented by the product of Nippon Oil and Fats Co., Ltd. under registered trademark designation of "BLEMMER"-DGT; heterocyclic epoxy resins represented by the product of Nissan Chemical Industries, Ltd. under product code of TEPIC and that of Ciba-Geigy Ltd. under registered trademark designation of "ARALDITE" PT810; bixylenol type epoxy resins represented by the product of Yuka Shell Epoxy Kabushiki Kaisha under registered trademark designation of "EPIKOTE" YX-4000; biphenol type epoxy resins represented by the product of Yuka Shell Epoxy Kabushiki Kaisha under registered trademark designation of "EPIKOTE" YL-6056; and tetraglycidyl xylenoyl ethane resins represented by the product of Tohto Kasei Co., Ltd. under product code of "ZX-1063" may be cited.

These epoxy compounds are prepared in a finely powdered from by the conventional procedure which comprises simply pulverizing a given epoxy compound and/or further crushing and dispersing the epoxy compound in combination with other components of composition such as the photosensitive prepolymer (A) in a kneader such as, for example, a roll mill. The epoxy compounds can be used either singly or in the form of a mixture consisting of two or more members. Desirably, the amount of the epoxy compound (D) to be used is such that the mixing ratio (A:D) of the photosensitive prepolymer (A) to the epoxy compound (D) falls in the range of 50–95:50–5, preferably 60–90: 40–10 (based on parts by weight). If the ratio exceeds 50:50, the composition suffers from deficiency in photosensitivity and in solubility of the unexposed part in the developing solution. If the ratio is less than 95:5, the various properties such as resistance to soldering temperature which are expected of solder resist are not acquired. Suitably, the particle size of the fine epoxy compound is not more than 50 $\mu$m, preferably not more than 30 $\mu$m. If the particle size exceeds 50 $\mu$m, the composition while being applied by the screen printing mentioned above displays a poor ability to permeate the screen and the produced coating tends to form pinholes in the surface thereof and, even when the application is effected by some other method, the applied coating acquires a coarse surface.

Optionally, an epoxy compound such as a bisphenol A type epoxy resin or bisphenol F type epoxy resin which exhibits solubility to said diluent (C) and possesses at least two epoxy groups in the molecular unit thereof may be used in the place of part of said sparingly soluble epoxy compound (D) to such an extent that the substitution brings abot practically no problem in terms of photosensitivity and solubility of the unexposed part in the developing solution. Desirably, the amount of this soluble epoxy compound (S) to be so used for substitution is such that the ratio of the soluble epoxy compound (S) to the sparingly soluble epoxy compound (D), S:D, is in the range of 0–60:100–40, preferably 0–40:100–60, and more preferably 0–30:100–70 and the ratio of the soluble epoxy compound (S) to the photosensitive prepolymer (A) is not more than 25:75, preferably not more than 20:80. If the latter ratio is more than 25:75, the unexposed part of the composition exhibits unduly low solubility in the developing solution and suffers part thereof to survive the development where the development is effected with an alkaline developing solution and the composition is corroded with the developing solution and the coating tends to suffer from separation or blister and becomes hardly usable where the development is effected with a solvent type developer. The additional use of the soluble epoxy compound produces an effect of enhancing part of the characteristic properties of solder resist such as, for example, resistance to plating.

Concrete examples of the soluble epoxy compound (S) are bisphenol A type epoxy resins represented by the products of Yuka Shell Epoxy Kabushiki Kaisha under registered trademark designation of "EPIKOTE" 1009 and 1031, those of Dainippon Ink and Chemicals, Inc. under registered trademark designation of "EPICLON" N-3050, -7050, and -9050, those of Asahi Chemical Industry Co., Ltd. under registered trademark designation of "AER"-664, -667, and -669, Tohto Kasei Co., Ltd. under registered trademark designation of "Epo Tohto" YD-012, -017, -014, -020, and -002, those of Ciba-Geigy Ltd. under registered trademark designation of "ARALDITE" XAC-5005, GT-7004, -6484T, and -6099; those of The Dow Chemical Company under registered trademark designation of "DER"-642U and -673MF, those of Asahi Denka Kogyo Co., Ltd. under registered trademark designation of "EP"-5400 and -5900; hydrogenated bisphenol A type epoxy resins represented by the products of Tohto Kasei Co., Ltd. under registered trademark designation of "Sun Tohto" ST-2004 and -2007; bisphenol F type epoxy resins represented by the products of Tohto Kasei Co., Ltd. under registered trademark designation of "Epo Tohto" YDF-2004 and -2007; brominated bisphenol A type epoxy resins represented by the products of Sakamoto Yakuhin Kogyo Co., Ltd. under product code of SR-BBS and SR-TBA-400, those of Asahi Denka Kogyo Co., Ltd. under product code of EP-62 and -66, those of Asahi Chemical Industry Co., Ltd. under registered trademark designation of "AER"-755 and -765, and Tohto Kasei Co., Ltd. under registered trademark designation of "Epo Tohto" YDB-600 and -715; novolak type epoxy resins represented by the products of Nippon Kayaku Co., Ltd. under registered trademark designation of "EPPN"-201, "EOCN"-103, -1020, and -1025, and "BREN", those of Asahi Chemical Industry Co., Ltd. under registered trademark designation of "AER" ECN-278, -292, and -299, those of Ciba-Geigy Ltd. under registered trademark designation of "ARALDITE" ECN-1273 and -1299, those of Tohto Kasei Co., Ltd. under registered trademark designation of "Epo Tohto" YDCN-220L, -220HH, -702, and -704, and YDPN-601 and -602, and those of Dainippon Ink and Chemicals, Inc. under registered trademark designation of "EPICLON" N-673, -680, -695, -770, and -775; novolak type epoxy resins of bisphenol A represented by the products of Asahi Denka Kogyo Co., Ltd. under registered trademark designations of "EPX"-8001 and -8002 and "EPPX"-8060 and -8061 and the product of Dainippon Ink and Chemicals, Inc. under registered trademark designation of "EPICLON" N-880; chelate type epoxy resins represented by the products of Asahi Denka Kogyo Co., Ltd. under registered trademark designation of "EPX"-49-60 and -49-30; glyoxal type epoxy resins represented by the product of Tohto Kasei Co., Ltd. under registered trademark designation of "Epo Tohto" YDG-414; amino group-containing epoxy resins represented by the products of Tohto Kasei Co., Ltd. under registered trademark designation of "Epo Tohto" YH-1402 and "Sun Tohto" ST-110 and Yuka Shell Epoxy Kabushiki Kaisha under registered trademark designation of "EPIKOTE" YL-931 and -933; rubber-modified epoxy resins represented by the product of Dainippon Ink and Chemcials, Inc. under registered trademark designation of "EPICLON" TSR-601 and the products of Asahi Denka Kogyo Co., Ltd. under registered trademark designation of "EPX"-84-2 and -4061; dicyclopentadiene phenolic type epoxy resins represented by the product of Sanyo-Kokusaku Pulp Co., Ltd. under registered trademark designation of "SK RESIN" DCE-400; silicone-modified epoxy resins represented by the product of ACR Company Ltd. under product code of X-1359; and $\xi$-caprolactone-modified epoxy resins represented by the products of Daicel Chemical Industries, Ltd. under product code of Placel G-402 and G-710. Further, partial esterification products of the aforementioned epoxy compounds (D and S) with (meth)acrylic acid are also usable for the substitution.

The photosensitive thermosetting resin composition obtained as described above functions fully satisfactorily as a solder resist without requiring additional use of a curing agent for epoxy resin because the photosensitive prepolymer (A) contains a hydroxyl group and/or a carboxyl group and the hydroxyl group and/or the carboxyl group in this prepolymer (A) functions as a curing agent for the epoxy resin. When the photoinitiator (B) contains an amino group-containing photoinitiator and/or photosensitizer intended for enhancement of photosensitivity, the curing of the epoxy compound (D) is further promoted by the effects of amino group of the photoinitiator and the photosensitizer. For the purpose of further enhancing such characteristic properties as fast adhesiveness, resistance to chemicals, and resistance to soldering temperature, however, it is desirable to use the photosensitive thermosetting resin composition as mixed with an extra curing agent for epoxy resin (E).

The curing agent for epoxy resin (E) may be, for example, imidazole derivatives such as the products of Shikoku Chemicals Co., Ltd. marketed under registered trade mark designation of "CUREZOL" 2MZ, 2E4MZ, $C_{11}Z$, $C_{17}Z$, 2PZ, 1B2MZ, 2MZ-CN, 2E4MZ-CN, $C_{11}Z$-CN, 2PZ-CN, 2PHZ-CN, 2MZ-CNS, 2E4MZ-CNS, 2PZ-CNS, 2MZ-AZINE, 2E4MZ-AZINE, $C_{11}Z$-AZINE, 2MA-OK, 2P4MHZ, 2PHZ, and 2P4BHZ; guanamines such as acetoguanamine, benzoguanamine, and 3,9-bis[2-(3,5-diamino-2,4,6-triazaphenyl)ethyl]b 2,4,8,10-tetraoxaspiro[5,5]undecane; polyamines such as diaminodiphenyl methane, m-phenylene diamine, diaminodiphenyl sulfone, cyclohexyl amine, m-xylylene diamine, 4,4'-diamino-3,3'-diethyldiphenyl methane, diethylene triamine, tetraethylene pentamine, N-aminoethyl piperazine, isophorone diamine, dicyandiamide, urea, urea derivatives, melamine, polybasic hydrazide, and organic acid salts thereof and/or epoxy adducts; amine complexes of boron trifluoride; tertiary amines such as trimethyl amine, triethanol amine, N,N-dimethyloctyl amine, N,N-dimethyl aniline, N-benzyldimethyl amine, pyridine, N-methyl pyridine, N-methyl morpholine, hexamethoxymethyl melamine, 2,4,6-tris(dimethylaminophenol), N-cyclohexyldimethyl amine, tetramethyl guanidine, and m-aminophenol; polyphenols such as polyvinyl phenol, polyvinyl phenol bromide, phenol novolak, and alkylphenol novolaks; organic phospines such as tributyl phosphine, triphenyl phosphine, and tris-2-cyanoethyl phosphine; phosphonium salts such as tri-n-butyl(2,5-dihydroxyphenyl)phosphonium bromide and hexadecyltributyl phosphonium chloride; quaternary ammonium salts such as benzyltrimethyl ammonium chloride, phenyltributyl ammonium chloride, and benzyltrimethyl ammonium bromide; anhydrides of the polybasic acids metnioned above; photo-cationic polymerization catalysts such as diphenyl iodonium tetrafluoroborate, triphenyl sulfonium hexafluoroantimonate, 2,4,6-triphenyl thiopyrilium hexafluorophosphate, the product of Ciba-Geigy Ltd. under registered trademark designation of "IRGACURE" 261, and styrenemaleic acid resin. Any conventional curing agents and curing promoters may be used. These curing agents for epoxy resin (E) can be used either singly or in the form of a mixture of two or more members. Desirably, the amount of said curing agent (E) to be used is in the range of 0 to 10% by weight, preferably 0.05 to 5% by weight, based on 100% by weight of the photosensitive thermosetting resin composition.

Optionally, such well known and widely used inorganic fillers as barium sulfate, barium titanate, silicon oxide powder, fine particulate silicon oxide, amorphous silica, talc, clay, magnesium carbonate, calcium carbonate, aluminum oxide, aluminum hydroxide, and mica powder can be used, as desired, for the purpose of enhancing the characteristic properties of the photosensitive thermosetting resin composition of this invention such as adhesion and hardness. The amount of the inorganic filler to be used is in the range of 0 to 60% by weight, preferably 5 to 40% by weight, based on 100% by weight of the photosensitive thermosetting resin composition. Further, well known and widely used additives such as coloring agents represented by phthalocyanine blue, phthalocyanine green, Iodine Green, disazo yellow, crystal violet, titanium dioxide, carbon black, and naphthalene black, thermopolymerization inhibitors represented by hydroquinone, hydroquinone monomethyl ether, tert-butyl catechol, pyrogallol, and phenothiazine, thickening agents represented by asbestos, bentonite, organophilic bentonite, and montmorillonite, anti-foaming agents represented by silicone type, fluorine type, and macromolecular type agents and/or leveling agents, and adhesiveness imparting agents represented by imidazole type, thiazole type, triazole type, and silane coupling agents may be additionally used.

It is also permissible to select and use well known and widely used binder resins such as copolymers of ethylenically unsaturated compounds, e.g. acrylic esters and polyester resins synthesized from polyhydric alcohols and saturated or unsaturated poylbasic acid compounds; and well know and widely used photosensitive oligomers such as polyester (meth)arcylates synthesized from polyhydric alcohols and saturated or unsaturated polybasic acid compounds and glycidyl (meth)acrylates, and urethane (meth)acrylates synthesized from polyhydric alcohols and diisocyanates and hydroxyl group-containing (meth)acrylates, in an amount such that the characteristic properties expected of a solder mask are not adversely effected.

The developing solution to be used for the formation of a solder resist pattern after the photosensitive thermosetting resin composition has been exposed to an actinic ray through a photomask is variable by the selection of the photosensitive prepolymer (A). The organic solvents usable as the developing solution include such organic solvents as cyclohexanone, xylene, tetramethylbenzene, butyl cellosolve, butyl carbitol, propylene glycol monomethyl ether, cellosolve acetate, propanol, propylene glycol, trichloroethane, trichloroethylene, and modified trichloroethanes (represented by the product of Asahi Chemical Industry Co., Ltd. under registered trademark designation of "ETHANA" IR, that of Toa Gosei Chemical Industry Co., Ltd. under registered trademark designation of "Three One" EX-R, that of Kanto Denka Kogyo Co., Ltd. under registered trademark designation of "KANDEN" triethane SR-A, and that of Asahi Glass Co., Ltd. under registered trademark designation of "Resi Solve" V-5) and/or aqueous alkali solutions of potassium hydroxide, sodium hydroxide, sodium carbonate, potassium carbonate, sodium phosphate, sodium silicate, ammonia, and amines, and/or aqueous surface active agent solutions, for example.

A coating of the photosensitive thermosetting resin composition can be formed on a substrate, for example a printed circuit board having circuits formed thereon, by applying the composition on the entire surface of the board by screen printing, curtain coating, roll coating, spray coating, or the like, by transforming the composition into a dry film and directly laminating the dry film on the board, or by applying the composition in the form of a liquid on the board and laminating a dry film on the applied layer of the liquid composition in a wet state or a dry state. The coating thus formed on the board is then directly exposed to a laser beam or selectively exposed through a photomask having a prescribed pattern to the actinic ray from a high-pressure mercury-vapor lamp, ultra-high-pressure mercury-vapor lamp, a metal halide lamp, a chemical lamp, a xenone lamp, or the like. The unexposed portion of the coating is developed with the developing solution to give rise to a resist pattern.

Since the photosensitive thermosetting resin composition of this invention uses a finely powdered epoxy compound sparingly soluble in the diluent to be used, it excels in developing property, enables the exposed portion to resist the developing solution, enjoys a long shelf life, and exhibits highly satisfactory photosensitivity. By subjecting the photosensitive thermosetting resin composition to a process of coating, exposing to the actinic radiation, developing, and then postcuring, there can be formed a solder resist pattern excelling in adhesion, insulation resistance, resistance to electrolytic corrosion, resistance to soldering temperature, resistance to solvents, resistance to alkalis, resistance to acids, and resistance to plating.

DETAILED DESCRIPTION OF PREFERRED EMBODIMENTS

Now, the present invention will be described more specifically below with reference to working examples and comparative experiments. It should be noted, however, that the present invention is not limited to these examples. Wherever "parts" and "%" are mentioned, they are invariably based on weight unless otherwise specified.

Preparation Example 1

In a three-neck flask provided with a stirrer and a condenser, 1,090 parts of a cresol novolak type epoxy resin having an epoxy equivalent of 218 (product of Tohto Kasei Co., Ltd. under registered trademark designation of "Epo Tohto" YDCN-702) was melted and stirred at a temperature in the range of 90° C. to 100° C. Then, 396 parts of acrylic acid, 0.6 part of hydroquinone, and 7.0 parts of benzyl dimethyl amine were added to the stirred molten resin. The resultant mixture was heated to a temperature in the range of 110° C. to 115° C. and stirred for reaction for 12 hours. The reaction mixture was removed from the flask and left cooling to normal room temperature, to obtain a complete esterification product (a-1) of the novolak type epoxy compound with acrylic acid having an acid value of 4.5 mg KOH/g. The product was in a semisolid state.

Preparation Example 2

A partial esterification product (a-2) of a novolak type epoxy compound with acrylic acid having an acid value of 0.5 mg KOH/g was obtained by following the procedure of Preparation Example 1, excepting the amount of acrylic acid was changed to 250 parts and the length of reaction time to 7 hours. The product was in a solid state. Preparation Example 3:

In the same reaction vessel as used in Preparation Example 1, 450 parts of the complete esterification product (a-1) obtained in Preparation Example 1, 125 parts of cellosolve acetate, and 125 parts of a tetramethyl benzene-based petrolic solvent (produced by Idemitsu Petrochemical Co., Ltd. under registered trademark designation of "IPSOL" #150) were dissolved at a temperature in the range of 70° C. to 80° C. Then, the hot molten mixture and 120 parts of phthalic anhydride added thereto were heated to a temperature in the range of 95° C. to 100° C and stirred for reaction for 8 hours. The resultant reaction mixture was removed from the reaction vessel and left cooling to normal room temperature. Consequently, there was obtained an organic solvent solution of an acid anhydride adduct (a-1-1) of said complete esterification product of the novolak type epoxy compound with acrylic acid whose solid component possessed an acid value of 85 mg KOH/g.

Preparation Example 4

In the same reaction vessel as used in Preparation Example 1, 87 parts of tolylene diisocyanate (a mixture of 65% of 2,4-position and 35% of 2,6-position), 50 parts of carbitol acetate, and 50 parts of Ipsol #150 were heated and stirred at 25° C. To the hot stirred mixture, a mixture consisting of 65 parts of 2-hydroxyethyl acrylate, 50 parts of cellosolve acetate, 50 parts of Ipsol #150, 0.05 part of phenothiazine, and 0.2 part of dibutyl tin dilaurate was added dropwise over a period of 2 hours, with the temperature thereof controlled below 35° C. Then, the resultant mixture was heated to 50° C. and stirred for reaction for 4 hours, to obtain a half urethane compound having a terminal acryl group. Then, the half urethane compound and 250 parts of the partial esterification product (a-2) obtained in Preparation Example 2 added thereto were heated to 80° C. and stirred for reaction for 6 hours and then left cooling to normal room temperature and removed from the reaction vessel. Consequently, there was obtained an organic solvent solution of a urethane acrylate adduct (a-2-2) of a partial esterification product of the novolak type epoxy compound with acrylic acid.

Preparation Example 5

In the same reaction vessel as used in Preparation Example 1, 105 parts of a phenol novolak type epoxy resin having an epoxy equivalent of 210 (product of Dainippon Ink and Chemicals, Inc. under registered trademark designation of "EPICLON" N-865) and 130 parts of cellosolve acetate were dissolved at a temperature in the range of 70° C. to 80° C. and stirred. Then, 120 parts of 4'-hydroxychalcone and 3.5 parts of benzyltrimethyl ammonium bromide were added to the hot stirred mixture. The resultant mixture was heated to a temperature in the range of 125° C. to 130° C. and stirred for reaction for 15 hours. The reaction mixture was left cooling to 80° C. and, with 40 parts of hexahydrophthalic anhydride mixed therewith, heated to a temperature in the range of 90° C. to 95° C. and stirred for reaction for 10 hours, removed from the reaction vessel, and left cooling to normal room temperature. Consequently, there was obtained an organic solvent solution of an acid anhydride adducts (b-1-1) of the complete etherification product of the novolak tyep epoxy compound with an unsaturated phenol compound whose solid component possessed an acid value of 58 mg KOH/g.

The products obtained in Preparation Examples 3, 4, and 5 were invariably in the form of a solution in an organic solvent. They would assume a solid state when they were dried by evaporation of respective organic solvents. This applies to the 50% butyl cellosolve solution of "DAISO DAP" (diallyl phthalate prepolymer produced by Daiso Co., Ltd.) used in Example 8 which will be described hereinafter.

Example 1

| | |
|---|---|
| Resin (a-1) obtained in Preparation Example 1 | 30.0 parts |
| Dipentaerythritol hexaacrylate | 9.0 parts |
| Diethylene glycol diacrylate | 22.0 parts |
| Benzyl dimethyl ketal | 4.0 parts |
| 2-(Dimethylamino)ethyl benzoate | 1.5 parts |
| Barium sulfate | 20.0 parts |
| Finely powdered talc | 5.0 parts |
| Phthalocyanine green | 0.5 part |
| Leveling agent (product of Monsanto Chemical Co. under registered trademark designation of "MODAFLOW") | 1.0 part |
| Finely powdered diglycidyl terephthalate (product of Nippon Oil and Fats Co., Ltd. under registered trademark designation of "BLEMMER") | 4.0 parts |
| Particulate bisphenol S type epoxy resin (product of Nippon Kayaku Co., Ltd. under registered trademark designation of "EBPS"-200) | 3.0 parts |
| Total: | 100.0 parts |

The components indicated above were premixed in the proportions indicated correspondingly and the premix was kneaded three times with a three-roll mill to produce a photosensitive thermosetting resin composition. By a test with a grind meter (produced by Toyo Seiki Seisakusho Co., Ltd.), this composition was found to possess a particle size of not more than 25 μm. This photosensitive thermosetting resin composition was applied by the screen printing method on the entire surface of a copper throughhole printed circuit board. Then, a photomask having a predetermined pattern was set as opposed to the coated surface across a space of 0.7 mm. The coating of the composition was then exposed through the photomask to a light from a collimating ultra-high-pressure mercury-vapor lamp exposure device (product of ORC manufacturing Co., Ltd.). The exposed coating was developed with modified trichloroethane (product of Asahi Chemical Industry Co., Ltd. under registered trademark designation of "ETERNA" IR) applied as developing solution by spraying under a pressure of 2.0 kg/cm². It was placed in a hot air circulation oven kept at a temperature of 200° C. and post-cured for 50 minutes, to form a solder resist pattern.

Example 2

| | |
|---|---|
| Resin (a-1) obtained in Preparation Example 1 | 25.0 parts |
| Resin (a-2) obtained in Preparation Example 2 | 15.0 parts |
| Cellosolve acetate | 23.0 parts |
| Pentaerythritol tetraacrylate | 5.5 parts |
| Benzyl dimethyl ketal | 3.5 parts |
| 2-Chlorothioxanthone | 2.5 parts |
| Barium sulfate | 11.0 parts |
| Finely powdered silicon oxide (product of Nippon Aerosil Co., Ltd. under registered trademark designation of "AEROSIL" #200) | 1.0 part |
| Phthalocyanine green | 0.5 part |
| Anti-foaming agent (product of Kyoeisha | 1.0 part |

| | |
|---|---|
| Chemical Co., Ltd. under the trade name of "FLOWLEN" AC-300) | |
| Finely powdered diglycidyl terephthalate (product of Nippon Oil and Fats Co., Ltd. under registered trademark designation of "BLEMMER"-DGT) | 10.0 parts |
| Curing agent (product of Shikoku Kasei Chemical Co., Ltd. marketed under registered trademark designation of "CUREZOL" 2PHZ | 2.0 parts |
| Total | 100.0 parts |

A photosensitive thermosetting resin composition was prepared by premixing the components indicated above in the proportions indicated correspondingly and kneading the premix twice with a three-roll mill. It was found to have a particle size of not more than 20 μm. This photosensitive thermosetting resin composition was applied to the entire surface of a copper through-hole printed circuit board with a roll coater (product of The Pilot Seiko Co., Ltd.). The board coated with the resin composition was placed in a hot air circulation oven, dried therein at 80° C. for 20 minutes, and then left cooling to room temperature, to produce a board with a dry coating.

A photomask having a predetermined pattern was placed contiguously on the coated surface of the board. The coating was exposed through the photomask to a light from a ultrahighpressure mercury-vapor lamp exposure device (product of ORC Manufacturing Co., Ltd.). The coated board was placed in a hot air circulation oven kept at a temperature of 150° C. and post-cured for 50 minutes. Consequently a solder resist pattern was formed by following the procedure of Example 1.

Example 3

| | |
|---|---|
| Resin (a-1-1) obtained in Preparation Example 3 | 45.0 parts |
| Propylene glycol monomethyl ether acetate | 5.0 parts |
| Dipentaerythritol hexaacrylate | 5.0 parts |
| 2-Hydroxyethyl acrylate | 2.0 parts |
| 2-Amyl anthraquinone | 3.5 parts |
| Benzyl | 2.0 parts |
| Aluminum oxide powder | 5.0 parts |
| Finely powdered talc | 5.0 parts |
| Barium sulfate | 11.0 parts |
| Phthalocyanine green | 0.5 part |
| "MODAFLOW" | 1.0 parts |
| Particulate bisphenol S type epoxy resin (product of Dainippon Ink and Chemicals Industries, Ltd. under registered trademark designation of "EPICLON" EXA-1514) | 15.0 parts |
| Total: | 100.0 parts |

A photosensitive thermosetting resin composition was prepared by following the procedure of Example 2 using the components indicated above in the proportions indicated correspondingly. It was found to have a particle size of not more than 20 μm. This photosensitive thermosetting resin composition was applied to the entire surface of a copper through-hole printed circuit board with a roll coater (product of The Pilot Seiko Co., Ltd.). The coated board was placed in a hot air circulation oven, dried at 70° C. for 20 minutes, and left cooling to room temperature, to obtain a board with a dry coating. This coating was given an exposure in the same manner as in Example 2, developed with an aqueous 1% sodium carbonate solution used as a developing solution and applied by spraying under a pressure of 2.0 kg/cm², washed with water, and then dried. The board with the dry coating was post-cured for 30 minutes in a hot air circulation oven kept at a temperature of 150 ° C., to form a solder resist pattern.

Example 4

| | |
|---|---|
| Resin (a-1-1) obtained in Preparation Example 3 | 45.0 parts |
| Solid diallyl phthalate prepolymer (product of Daiso Co., Ltd. under registered trademark designation of "DAISO DAP") | 5.0 parts |
| Cellosolve acetate | 5.0 parts |
| Trimethylol propane triacrylate | 4.0 parts |
| Triethylene glycol diacrylate | 3.0 parts |
| 2-Methyl-1-[4-(methylthio)phenyl]-2-morpholinopropan-1-one | 3.0 parts |
| 2,4-Diisopropyl thioxanthone | 2.5 parts |
| Clay | 11.0 parts |
| Finely powdered talc | 5.0 parts |
| Phthalocyanine green | 0.5 part |
| "MODAFLOW" | 1.0 part |
| Particulate bixylenol type epoxy resin (product of Yuka Shell Epoxy Kabushiki Kaisha under registered trademark designation of "EPIKOTE" YX-4000) | 12.0 parts |
| Dicyandiamide | 2.0 parts |
| Curing agent (product of Shikoku Chemicals, Co. under registered trademark designation of "CUREZOL" 2E4MZ-CNS) | 1.0 part |
| Total: | 100.0 parts |

A photosensitive thermosetting resin composition was prepared by following the procedure of Example 2, excepting the components indicated above were used in the proportions indicated correspondingly instead. This composition was found to have a particle size of not more than 25 μm. This photosensitive thermosetting resin composition was applied by the screen printing method on the entire surface of a copper through-hole printed circuit board. By subjecting the coated board to the procedure of Example 3, a solder resist pattern was formed.

Example 5

| | |
|---|---|
| Resin (a-2-2) obtained in Preparation Example 4 | 30.0 parts |
| Butyl cellosolve | 12.0 parts |
| Pentaerythritol tetraacrylate | 5.0 parts |
| Hydroxycyclohexyl phenyl ketone | 3.0 parts |
| N,N-dimethylaminoacetophenone | 1.0 part |
| Barium sulfate | 10.0 parts |
| Finely powdered talc | 4.0 parts |
| Phthalocyanine green | 0.5 part |
| "AC-300" | 0.5 part |
| Pariticulate bisphenol S type epoxy resin (product of Asahi Denka Kogyo Co., Ltd. under registered trademark designation of "EPX-30") | 15.0 parts |
| "2PHZ" | 1.0 part |
| Total: | 82.0 parts |

A photosensitive thermosetting resin composition was prepared by following the procedure of Example 1, excepting the components indicated above were used in the proportions correspondingly indicated instead. This composition was found to have a particle size of not more than 30 μm. A mixture of 82 parts of the photosensitive thermosetting resin composition and 18 parts of a 1:1 mixed solvent of toluene and butyl cellosolve was applied on the entire surface of a copper through-hole printed circuit board with a curtain coater (product of Hiyama Industries Co., Ltd.) and subsequently treated by following the procedure of Example 2. Thus, a solder resist pattern was formed.

Example 6

| | |
|---|---|
| Resin (a-2-2) obtained in Preparation Example 4 | 35.0 parts |
| Carbitol acetate | 10.0 parts |
| Dipentaerythritol hexaacrylate | 3.0 parts |
| Diethylene glycol diacrylate | 3.0 parts |
| Benzyl dimethyl ketal | 3.0 parts |
| N,N-dimethylaminoacetophenone | 1.5 parts |
| Barium sulfate | 10.0 parts |
| Amorphous silica | 15.0 parts |
| phthalocyanine green | 0.5 part |
| "AC-300" | 1.5 parts |
| 75% cellosolve acetate solution of novolak type epoxy resin (product of Nippon Kayaku Co., Ltd. under registered trademark designation of "EPPN-201") | 3.0 parts |
| Finely powdered heterocyclic epoxy resin (product of Ciba-Geigy Ltd. under registered trademark designation of "ARALDITE" PT 810) | 12.0 parts |
| Dicyandiamide | 2.0 parts |
| Curing agent (product of Shikoku Chemicals co. under registered trademark designation of "CUREZOL" 2P4MHZ) | 0.5 part |
| Total: | 100.0 parts |

A photosensitive thermosetting resin composition was prepared by following the procedure of Example 1, excepting the components indicated above were used in the proportions correspondingly indicated instead. This composition was found to have a particle size of not more than 20 μm. A solder resist pattern was formed by following the procedure of Example 2, using this photosensitive thermosetting resin composition.

Example 7

| | |
|---|---|
| Resin (b-1-1) obtained in Preparation Example 5 | 25.0 parts |
| Resin (a-1-1) obtained in Preparation Example 3 | 10.0 parts |
| Carbitol acetate | 10.0 parts |
| Pentaerythritol tetraacrylate | 7.0 parts |
| 2-Ethylanthraquinone | 3.0 parts |
| "Aerosil #200" | 1.5 parts |
| Finely powdered talc | 3.0 parts |
| Silicon oxide powder | 20.0 parts |
| Phthalocyanine green | 0.5 parts |
| "MODAFLOW" | 1.5 parts |
| 75% cellosolve acetate solution of bisphenol A type epoxy resin (product of Yuka Shell Epoxy Kabushiki Kaisha under registered trademark designation of "EPIKOTE" 1009) | 5.0 parts |
| Finely powdered heterocyclic epoxy resin "product of Nissan Chemical Industries, Ltd. under product code of "TEPIC") | 10.0 parts |
| Polyvinyl phenol (product of Cosmo Oil Company, Ltd. under product code of "RESIN M") | 2.0 parts |
| "2PHZ" | 1.5 parts |
| Total: | 100.0 parts |

A photosensitive thermosetting resin composition was prepared by following the procedure of Example 2, excepting the components indicated above were used in the proportions correspondingly indicated instead. This composition was found to have a particle size of not more than 20 μm. A solder resist pattern was formed by following the procedure of Example 4, using this photosensitive thermosetting resin composition.

Example 8

| | |
|---|---|
| 50% Butyl cellosolve solution of "DAISO DAP" | 53.0 parts |
| Pentaerythritol tetraacrylate | 7.0 parts |
| Dimethylbenzyl ketal | 3.5 parts |
| 2-(Dimethylamino)ethyl benzoate | 1.5 parts |
| Finely powdered talc | 9.5 parts |
| Barium sulfate | 10.0 parts |
| "AC-300" | 1.0 part |
| Phthalocyanine green | 0.5 part |
| Finely powdered biphenol type epoxy resin (product of Yuka Shell Epoxy Kabushiki Kaisha under registered trademark designation of "EPIKOTE" YL-6056) | 5.0 parts |
| Particulate bisphenol S type epoxy resin (product of Dainippon Ink and Chemicals, Inc. under registered trademark designation of "EPICLON"EXA-1514) | 7.0 parts |
| 2-Phenyl-4-benzyl-5-hydroxymethyl imidazole | 2.0 parts |
| Total: | 100.0 parts |

A photosensitive thermosetting resin composition was prepared by following the procedure of Example 2, excepting the components indicated above were used in the proportions correspondingly indicated instead. This composition was found to have a particle size of not more than 20 μm. From this photosensitive thermosetting resin composition, a solder resist pattern was formed by following the procedure of Example 2, excepting the developing solution was changes to 1,1,1-trichloroethane.

Comparative Experiment 1

| | |
|---|---|
| Resin (a-1) obtained in Preparation | 40.0 parts |
| Cellosolve acetate | 22.0 parts |
| Pentaerythiritol tetraacrylate | 7.0 parts |
| 2-Ethyl anthraquinone | 2.0 parts |
| 1-Chlorothioxanthone | 2.5 parts |
| Finely powdered talc | 10.0 parts |
| Barium sulfate | 15.0 parts |
| Phthalocyanine green | 0.5 part |
| Anti-foaming agent (product of Kyoeisha Chemical Co., Ltd. under the trade name of "FLOWLEN"AC-300) | 1.0 part |
| Total: | 100.0 parts |

A photosensitive resin composition was prepared by following the procedure of Example 2, excepting the components for a comparative composition indicated above were used in the proportions indicated correspondingly instead. From this resin composition, a solder resist pattern was formed by following the procedure of Example 2, excepting the post-curing by application of heat was omitted.

Comparative Experiment 2

| | | |
|---|---|---|
| Resin (a-1-1) obtained in Preparation Example 3 | 42.0 | parts |
| Trimethylol propane triacrylate | 6.0 | parts |
| Butyl cellosolve | 4.0 | parts |
| Benzyl dimethyl ketal | 3.5 | parts |
| 2-Ethyl anthraquinone | 1.5 | parts |
| Barium sulfate | 12.0 | parts |
| Finely powdred talc | 8.0 | parts |
| Phthalocyanine green | 0.5 | part |
| "MODAFLOW" | 1.5 | parts |

| | | |
|---|---|---|
| 75% butyl cellosolve solution of novolac type epoxy resin (product. of Tohto Kasei Co., Ltd. under registered trademark designation of "Epo Tohto"YDCN-702) | 18.0 | parts |
| Dicyandiamide | 2.0 | parts |
| Curing agent (product of Shikoku Chemicals, Ltd. under registered trademark designation of "CUREZOL" 2PZ-CNS) | 1.0 | part |
| Total: | 100.0 | parts |

A photosensitive thermosetting resin composition was prepared by following the procedure of Example 2, excepting the components for a comparative composition indicated above were used in the proportions indicated correspondingly instead. From this photosensitive thermosetting resin composition, a solder resist pattern was formed by following the procedure of Example 3.

Comparative Experiment 3

| | | |
|---|---|---|
| Resin (a-2-2) obtained in Preparation Example 4 | 40.0 | parts |
| Cellosolve acetate | 5.0 | parts |
| Dipentaerythritol hexaacrylate | 4.0 | parts |
| Diethylene glycol diacrylate | 3.0 | parts |
| Benzyl dimethyl ketal | 3.0 | parts |
| Finely powdered talc | 11.0 | parts |
| Clay | 12.0 | parts |
| Phthaloctanine green | 0.5 | part |
| "MODAFLOW" | 1.5 | parts |
| 75% cellosolve acetate solution of bisphenol A type epoxy resin (product of Yuka Shell Epoxy Kabushiki Kaisha under registered trademark designation of "EPIKOTE" 1007) | 15.0 | parts |
| Diaminodiphenyl sulfone | 2.0 | parts |
| Curing agent (product of Shikoku Chemicals Co. under registered trademark designation of "CUREZOL" 2MZ-AZIN) | 1.0 | part |
| Total: | 100.0 | parts |

A photosensitive thermosetting resin composition was prepared by following the procedure of Example 2, excepting the components for a comparative composition indicated above were used in the proportions indicated correspondingly. From this photosensitive thermosetting resin composition, a solder resist pattern was formed by following the procedure of Example 6.

The resin compositions for solder resist and the solder resist patterns obtained in Examples 1 to 8 and Comparative Experiments 1 to 3 mentioned above were tested for various properties. The results are shown in Table 1.

The properties indicated in Table 1 were tested by the following methods and evaluated by the scales indicated correspondingly.

(1) Test for photosensitivity

The photosensitivity was determined by exposing a sample to an ultraviolet light 365 nm in wavelength to a varying dosage of 500, 750, or 1,000 mJ/cm$^2$ with the aid of an integral actinometer (product of Orc Manufacturing Co., Ltd.), developing the exposed sample for 60 seconds with a relevant developing solution applied by spraying under a pressure of 2 kg/cm$^2$, and visually rating the condition of the coating consequently produced on the following four-point scale.

⊚: Perfect absence of discernible change
○: Slight change of surface
△: Conspicuous change of surface
x: Exfoliation of coating (2) Test for developing property The developing property was determined by exposing a sample through a relevant photomask to an ultraviolet light 365 nm in wavelength to a dosage of 750 mJ/cm$^2$ with the aid of an integral actinometer (product of ORC Manufacturing Co., Ltd.) thereby producing a test piece, developing the test piece for a varying duration of 20, 40, or 60 seconds with a relevant developing solution applied by spraying under apressure of 2 kg/cm$^2$, and visually rating the condition of removal of the unexposed part of the coating on the following four-point scale.

⊚: Perfect development
○: Survival of thin undeveloped surface portion
△: Survival of undeveloped portion throughout the entire surface
x: Substantial absence of development (3) Test for adhesion The adhesion was determiend by exposing a sample through a relevant photomask to an ultraviolet light 365 nm in wavelength to a dosage of 750 mJ/cm$^2$ with the aid of an integral actinometer (product of ORC Manufacturing Co., Ltd.), developing the exposed smaple for 60 seconds with a relevant developing solution applied by spraying under a pressure of 2 kg/cm$^2$, post-curing the developed sample under varying conditions thereby producing a test piece, incising cross cuts in the test piece after the pattern of a checkerboard as specified by Japanese Industrial standard (JIS) D 0202, and subjecting the incised test piece to a peeling test using an adhesive cellophane tape (Cello Tape ®) and visually rating the condition of peeling on the following four-point scale.

⊚: Total absence of peeling (100/100)
○: Slight peeling in cross-cut portions (100/100)
△: 50/100 to 90/100
x: 0/100 to 50/100

(4) Test for pencil hardness

The pencil hardness was determined by measuring hardness of the same test piece as used in the test for adhesion in accordance with the method specified in JIS K 5400 under a fixed load of 1 kg.

(5) Test for resistance to acids

This property was determined by keeping the same test piece as used in the test for ahesion immersed in an aqueous 10 vol% sulfuric acid solution at 20° C. for 30 minutes, removing the test piece from the aqueous solution, and rating the test piece comprehensively with respect to film condition and adhesion on the following four-point scale.

⊚: Absolute absence of discernible change
○: Very slight presence of change
△: Presence of conspicuous change
x: Occurrence of blister or swell or separation of coating (6) Test for resistance to alkalis This property was determined by following the procedure of the test for resistance to acids, excepting an aqueous 10 wt% sodium hydroxide solution was used in the place of the aqueous 10 vol% sulfuric acid solution.

(7) Test for resistance to solvent until the viscosity of the sample immediately after manufacture rose to twice the original value.

TABLE 1

| | | Example | | | | | | | | Comparative Experiment | | |
|---|---|---|---|---|---|---|---|---|---|---|---|---|
| | | 1 | 2 | 3 | 4 | 5 | 6 | 7 | 8 | 1 | 2 | 3 |
| Photosensitivity (1) | ml/cm² 500 | o | o | | | | o | Δ | o | o | Δ | x |
| | 750 | | | | | | | o | | o | o | Δ |
| | 1000 | | | | | | | | | | | Δ |
| Developing property (2) | sec. 20 | o | o | o | o | Δ | Δ | Δ | o | o | x | x |
| | 40 | | | | | o | o | o | | o | x | Δ |
| | 60 | | | | | | | | | | Δ | o |
| Adhesion (3) | | o | | | | | | | | x | | o |
| Pencil hardness (4) | | 6H | 8H | 6H | 6H | 6H | 9H | 8H | 5H | H | 4H | 3H |
| Resistance to acids (5) | | o | | | | | | | | x | | o |
| Resistance to alkalis (6) | | o | | o | | | | | | x | Δ | Δ |
| Resistance to solvents (7) | | o | | o | o | | | | o | Δ | o | Δ |
| Resistance to plating (8) | | Δ | o | o | | o | | | | x | Δ | Δ |
| Resistance to soldering temperature (9) | Once | | | | | | | | | x | | o |
| | 3 times | | | | | | | | | — | o | o |
| | 5 times | o | | | | | | | | — | Δ | Δ |
| Insulation resistance (10) | Normal Conditions | 9.6 ×10¹² | 3.2 ×10¹³ | 2.6 ×10¹³ | 2.5 ×10¹³ | 2.3 ×10¹³ | 3.6 ×10¹³ | 5.4 ×10¹³ | 1.6 ×10¹³ | 6.1 ×10¹² | 2.1 ×10¹³ | 2.0 ×10¹³ |
| | After moisture | 4.5 ×10¹¹ | 2.1 ×10¹² | 1.9 ×10¹² | 3.8 ×10¹² | 6.2 ×10¹² | 7.3 ×10¹² | 3.8 ×10¹² | 2.6 ×10¹² | 8.6 ×10⁸ | 5.4 ×10¹⁰ | 3.8 ×10¹⁰ |
| Shelf life (11) | | 90 | 40 | 25 | 25 | 45 | 40 | 20 | 70 | 120 | 7 | 15 |

This property was determined by following the procedure of the test for resistance to acids, excepting acetone was used in the place of the aqueous 10 vol% sulfuric acid solution.

(8) Test for resistance to plating

This property was determined by plating the same test piece as used in the test for adhesion in a gold plating liquid (product of Electro Plating Engineers of Japan, Ltd. under registered trademark designation of "AUTRONEX" CI) at 30° C. for 9 minutes with a current density of 1 A/dm² thereby depositing a gold plate 1.5 μm in thickness and examining the condition of produced coating in the same manner as in the test for resistance to acids.

(9) Test for resistance to soldering temperature

This property was determined by dipping the same test piece as used in the test for adhesion once, three times, or five times each for 10 seconds in a soldering bath at 260° C. in accordance with the method specified in JIS C 6481 and rating the condition of the coating consequently produced in the same manner as in the test for resistance to acids.

(10) Determination of insulation resistance

The test pieces were prepared under the same conditions as in the test for adhesion, using a comb-shaped test pattern of IPC-B-25. The insulation resistance of each test piece was measured under normal conditions and again after allowing the test piece to stand absorbing moisture for 7 days under temperature cycle between 25° C. and 65° C. at fixed relative humidity of 90%, under application of an electric current of D.C. 100 V.

(11) Determination of shelf life

This property was determined by allowing a sample to be stored at 20° C. and counting the days of standing It is clearly noted from the results given in Table 1 that the photosensitive thermosetting resin compositions obtained in the working examples of the present invention were highly satisfactory in photosensitivity and developing property and the solder resist patterns obtained correspondingly were excellent in adhesion, hardness, resistance to acids, resistance to alkalis, resistance to solvents, and resistance to plating. In contrast, the resin composition obtained in Comparative Experiment 1, containing no thermally curing component and consequently having undergone no post-curing treatment, was inferior in such properties as adhesion, resistance to chemicals, and resistance to plating which are expected of a solder resist. The resin compositions obtained in Comparative Experiments 2 and 3, incorporating an epoxy resin as a thermally curing component and consequently having undergone a post-curing treatment, were deficient in developing property in the development with an alkali developing solution (Comparative Experiment 2) or in photosensitivity in the development with a solvent developing solution (Comparative Experiment 3), because the epoxy resin used at all was soluble in the solvent.

From the foregoing detailed description, it will be evident that there are a number of changes, adaptations, and modifications of the present invention which come within the province of those skilled in the art. However, it is intended that all such variations not departing from the spirit of the invention be considered as within the scope thereof as limited solely by the claims appended hereto.

What we claim is:

1. A photosensitive thermosetting-resin composition, comprising (A) a potosensitive prepolymer containing at least two ethylenically unsaturated bonds in the molecular unit thereof, (B) a photoinitiator, (C) a photopolymerizable vinyl monomer and/or an organic solvent as a diluent, and (D) a finely powdered epoxy compound containing at least two epoxy groups in the molecular unit thereof and exhibiting sparing solubility in the diluent to be used.

2. A composition according to claim 1, wherein said finely powdered epoxy compound has a particle size not exceeding 50 μm.

3. A composition according to claim 1, wherein said finely powdered epoxy compound is at least one epoxy resin in the form of solid or semisolid at ambient temperature selected from the group consisting of bisphenol S type epoxy resin, diglycidyl phthalate resin, heterocyclic epoxy resin, bixylenol type epoxy resin, biphenol type epoxy resin, and tetraglycidyl xylenoyl ethane resin.

4. A composition according to claim 1, wherein the mixing ratio (A:D) of said photosensitive prepolymer (A) to said finely powdered epoxy compound (D) is in the range of 50–95:50–5 (based on weight).

5. A composition according to claim 1, wherein a part of said finely powdered epoxy compound sparingly soluble in the diluent to be used is replaced by a soluble epoxy compound possessing at least two epoxy groups in the molecular unit thereof.

6. A composition according to claim 5, wherein the mixing ratio of said sparingly soluble, finely powdered epoxy compound to said soluble epoxy compound is in the range of 40–100:60–0 (based on weight).

7. A composition according to claim 5, wherein said soluble epoxy compound is at least one epoxy resin selected from the group consisting of bisphenol A type epoxy resin, hydrogenated bisphenol A type epoxy resin, bisphenol F type epoxy resin, brominated bisphenol A type epoxy resin, novolak type epoxy resin, novolak type epoxy resin of bisphenol A, chelate type epoxy resin, glyoxal type epoxy resin, amino group-containing epoxy resin, rubber-modified epoxy resin, dicyclopentadiene phenolic type epoxy resin, silicone-modified epoxy resin, and ε-caprolactone-modified epoxy resin.

8. A composition according to claim 1, wherein the amount of said diluent to be incorporated is in the range of 20 to 300 parts by weight, based on 100 parts by weight of said photosensitive prepolymer.

9. A composition according to claim 8, wherein said diluent is at least one polymerizable vinyl monomer selected from the group consisting of hydroxyalkyl (meth)-acrylates, mono- and di-(meth)acrylates of glycols, acrylamides, aminoalkyl (meth)acrylates, polyfunctional (meth)acrylates of polyhydric alcohols and of ethylene oxide or propylene oxide adducts thereof, (meth)acrylates of phenols and of ethylene oxide or propylene oxide adducts thereof, (meth)acrylates of glycidyl ethers and melamine (meth)acrylates.

10. A composition according to claim 8, wherein said diluent is at least one organic solvent selected from the group consisting of ketones, aromatic hydrocarbons, glycol ethers, esters, alcohols, aliphatic hydrocarbons, and petrolic type solvents.

11. A composition according to claim 1, wherein the amount of said photoinitiator to be incorporated is in the range of 0.2 to 30 parts by weight, based on 100 parts by weight of said photosensitive prepolymer.

12. A composition according to claim 1, wherein said photosensitive prepolymer is at least one photosensitive prepolymer selected from the group consisting of complete esterification products or partial esterification products formed by the esterification of a novolak type epoxy compound with an unsaturated monocarboxylic acid; reaction products obtained by causing the secondary hydroxyl group of the esterification product resulting from said esterification to react with a saturated or unsaturated polybasic acid anhydride; reaction products obtained by causing the reaction product of diisocyanate and a (meth)acrylate possessing one hydroxyl group in the molecular unit thereof to react with the secondary hydroxyl group of said esterification product; complete etherification products or partial etherification products formed by the etherification of a novolak type epoxy compound with an unsaturated phenol compound; reaction products obtained by causing the secondary hydroxyl group of the etherification product resulting from said etherification to react with a saturated or unsaturated polybasic acid anhydride; reaction products obtained by causing the reaction product of diisocyanate with a (meth)-acrylate possessing one hydroxyl group in the molecular unit thereof to react with the secondary hydroxyl group of said etherification product; and allyl compounds such as diallyl phthalate prepolymers and diallyl isophthalateprepolymers.

13. A composition according to claim 1, wherein said photosensitive prepolymer is solid or semisolid at ambient temperature.

14. A composition according to claim 12, wherein said novolak type epoxy compound is obtained by first causing phenols such as phenol, cresol, a halogenated phenol, or alkyl phenol to react with formaldehyde in the presence of an acidic catalyst and then causing the resultant novolak to react with epichlorohydrin and/or methyl epichlorohydrin.

15. A composition according to claim 12, wherein said novolak type epoxy compound is a cresol novolak type epoxy compound.

16. A composition according to claim 12, wherein said esterification product or etherification product is a reaction product obtained by causing said novolak type epoxy comopund and said unsaturated monocarboxylic acid or unsaturated phenol compound to react with each other in relative amounts such that the ratio of number of equivalents of epoxy group/number of equivalents of carboxyl group or the ratio of number of equivalents of epoxy group/number of equivalents of phenolic hydroxyl group is in the range of 0.8 to 3.3.

17. A composition according to claim 12, wherein said esterification product or etherification product is the complete esterification product or complete etherification product obtained by causing said novolak type epoxy compound and said unsaturated monocarboxylic acid or unsaturated phenol compound to react with each other in relative amounts such that the ratio of number of equivalents of epoxy group/number of equivalents of carboxyl group or the ratio of number of equivalents of epoxy group/number of equivalents of phenolic hydroxyl group is in the range of 0.9 to 1.1.

18. A composition according to claim 12, wherein said photosensitive prepolymer is a reaction product obtained by causing said esterification product or etherification product and said saturated or unsaturated polybasic acid anhydride to react with each other in relative amounts such that the ratio of number of equivalents of acid anhydride to number of equivalents of the secondary hydroxyl group of said esterification product or etherification product is not less than 0.3, and an acid value of the produced resin is in the range of 30 to 160 mg KOH/g, preferably 45 to 120 mg KOH/g and the residual ratio of epoxy group is not more than 20%.

19. A composition according to claim 12, wherein said photosensitive prepolymer is a reaction product obtained by first causing a diisocyanate and a (meth)a- crylate possessing one hydroxyl group in the molecular unit thereof to react with each other in an equimolar ratio thereby producing a half urethane (meth)acrylate and then causing said half urethane (meth)acrylate to react with the secondary hydroxyl group of said esterification product or etherification product in relative amounts such that the ratio of number of equivalents of isocyanate group of said half urethane (meth)acrylate to number of equivalents of said secondary hydroxyl group possessed by said esterification product or etherification product is in the range of 0.1 to 1.0.

20. A composition according to claim 1, which further comrpises a curing agent or curing promotor for epoxy resin in an amount of up to 10% by weight, based on the amount of said photosensitive thermosetting resin composition.

21. A composition according to claim 20, wherein said curing agent or curing promotor is selected from the group consisting of imidazole derivatives, guanamines, polyamines or organic acid salts thereof or epoxy adducts thereof, tertiary amines, polyphenols, organic phosphines, phosphonium salts, quaternary ammonium salts, polybasic acid anhydrides, photocationic polymerization catalysts, and styrene-maleic acid resin.

22. A composition according to claim 1, which further comprises an inorganic filler.

23. A composition according to claim 1, which further comprises at least one additive selected from the group consisting of coloring agents, polymerization inhibitors, thickening agents, anti-foaming agent, leveling agent, and adhesion promotors.

24. A method of forming a solder resist pattern on a printed circuit board, which comprises applying on the surface of said printed circuit board a photosensitive thermosetting resin composition comprising (A) a photosensitive prepolymer containing at least two ethylenically unsaturated bonds in the molecular unit threof, (B) a photopolymerization initiator, (C) a photopolymerizable vinyl monomer and/or an organic solvent, as a diluent, (D) a finely powdered epoxy compound containing at least two epoxy groups in the molecular unit thereof and exhibiting sparing solubility in the diluent to be used, and optionally (E) a curing agent, for epoxy resin, exposing the applied layer of said composition selectively to an actinic ray through a photomask having a given pattern, developing the unexposed portion of the applied layer with a developing solution thereby giving rise to a resist pattern, and thereafter thermosetting said finely powdered epoxy compound by application of heat.

25. A method according to claim 24, wherein said developing solution is at least one selected from the group consisting of cyclohexanone, xylene, tetramethyl benzene, butyl cellosolve, butyl carbitol, propylene glycol monomethyl ether, cellosolve acetate, propanol, propylene glycol, trichloroethane, trichloroethylene, modified trichloroethane, aqueous potassium hydroxide solution, aqueous sodium hydroxide solution, aqueous potassium carbonate solution, aqueous sodium phosphate solution, aqueous sodium silicate solution, aqueous solution of ammonia, aqueous amine solution, and aqueous solution of surface active agent.

26. A method according to claim 24, wherein said photosensitive thermosetting resin composition is applied to a printed circuit board by such a method as screen printing, curtain coating, roll coating, or spray coating.

27. A method according to claim 24, wherein said photosensitive thermosetting resin composition is transformed into a dry film and said dry film is directly laminated on said printed circuit board or laminated on a wet film of said photosensitive thermosetting resin composition coated in advance on said board.

28. A method according to claim 24, wherein said exposure is effected with said photomask held in contact or not in contact with the coating.

* * * * *

REEXAMINATION CERTIFICATE (2186th)

United States Patent [19]
Kamayachi et al.

[11] B1 4,943,516
[45] Certificate Issued Jan. 11, 1994

[54] PHOTOSENSITIVE THERMOSETTING RESIN COMPOSITION AND METHOD OF FORMING SOLDER RESIST PATTERN BY USE THEREOF

[75] Inventors: Yuichi Kamayachi; Kenji Sawazaki; Morio Suzuki; Shoji Inagaki, all of Saitama, Japan

[73] Assignee: Taiyo Ink Manufacturing Co., Ltd., Tokyo, Japan

Reexamination Request:
No. 90/002,668, Mar. 12, 1992

Reexamination Certificate for:
Patent No.: 4,943,516
Issued: Jul. 24, 1990
Appl. No.: 274,966
Filed: Nov. 22, 1988

[30] Foreign Application Priority Data
Nov. 30, 1989 [JP]   Japan ................. 62-299967

[51] Int. Cl.$^5$ .................. G03F 7/027; G03C 1/72
[52] U.S. Cl. .................. 430/280; 430/271; 430/281; 430/286; 430/287; 430/288; 430/313; 430/325; 430/330; 522/26; 522/103; 528/113; 427/177; 427/510; 427/517
[58] Field of Search ............ 430/280, 325, 330, 288, 430/281, 286, 287; 522/26; 528/113; 427/43.1, 177

[56] References Cited

U.S. PATENT DOCUMENTS

| | | | |
|---|---|---|---|
| 4,438,189 | 3/1984 | Geissler et al. | 430/280 |
| 4,544,623 | 10/1985 | Andykowski et al. | 430/280 |
| 4,996,132 | 2/1991 | Tazawa et al. | 430/280 |
| 5,009,982 | 4/1991 | Kamayachi et al. | 430/280 |
| 5,055,378 | 10/1991 | Miyamura et al. | 430/280 |

FOREIGN PATENT DOCUMENTS

58-42040   3/1983   Japan .
2175908   12/1986   United Kingdom .

OTHER PUBLICATIONS

Applicants' representative's letter of May 26, 1992 to European Associate European Patent Office Action.

*Primary Examiner*—Charles L. Bowers, Jr.

[57] ABSTRACT

A photosensitive thermosetting resin composition, comprising (A) a photosensitive prepolymer containing at least two ethylenically unsaturated bonds in the molecular unit thereof, (B) a photoinitiator, (C) a photopolymerizable vinyl monomer and/or an organic solvent as a diluent, (D) a finely powdered epoxy compound containing at least two epoxy groups in the molecular unit thereof and exhibiting sparing solubility in the diluent to be used, and optionally (E) a curing agent for epoxy resin, excels in developing property and sensitivity and enjoys a long shelf life.

By subjecting this photosensitive thermosetting resin composition to coating, exposure, development, and postcuring, there can be formed a solder resist pattern which excels in adhesion, insulation resistance, resistance to electrolytic corrosion, resistance to soldering temperature, resistance to chemicals, and resistance to plating.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 3 and 12 having been finally determined to be unpatentable, are cancelled.

Claims 1, 14–19 and 24 are determined to be patentable as amended.

Claims 2, 4–11, 13, 20–23 and 25–28, dependent on an amended claim, are determined to be patentable.

1. A photosensitive thermosetting-resin composition, comprising (A) a photosensitive prepolymer containing at least two ethylenically unsaturated bonds in the molecular unit thereof, (B) a photoinitiator, (C) a photopolymerizable vinyl monomer and/or an organic solvent as a diluent, and (D) a finely powdered epoxy compound containing at least two epoxy groups in the molecular unit thereof and exhibiting sparing solubility in the diluent to be used, *said photosensitive prepolymer (A) being at least one photosensitive prepolymer selected from the group consisting of complete esterification products or partial esterification products formed by the esterification of a novolak type epoxy compound with acrylic acid or methacrylic acid; reaction products obtained by causing the secondary hydroxyl group of the esterification product resulting from said esterification to react with a saturated or unsaturated polybasic acid anhydride; reaction products obtained by causing the reaction product of diisocyanate and a (meth)acrylate possessing one hydroxyl group in the molecular unit thereof to react with the secondary hydroxyl group of said esterification product; and allyl compounds such as diallyl phthalate prepolymers and diallyl isophthalate prepolymers, and said finely powdered epoxy compound (D) being at least one epoxy resin in the form of solid or semisolid at ambient temperature selected from the group consisting of diglycidyl phthalate resin, heterocyclic epoxy resin, bixylenol type epoxy resin, and biphenol type epoxy resin.*

14. A composition according to claim [12] *1*, wherein said novolak type epoxy compound is obtained by first causing phenols such as phenol, cresol, a halogenated phenol, or alkyl phenol to react with formaldehyde in the presence of an acidic catalyst and then causing the resultant novolak to react with epichlorohydrin and/or methyl epichlorohydrin.

15. A composition according to claim [12] *1*, wherein said novolak type epoxy compound is a cresol novolak type epoxy compound.

16. A composition according to claim [12] *1*, wherein said esterification product [or etherification product] is a reaction product obtained by causing said novolak type epoxy [comopound] *compound* and [said unsaturated monocarboxylic acid or unsaturated phenol compound] *acrylic acid or methacrylic acid* to react with each other in relative amounts such that the ratio of number of equivalents of epoxy group/number of equivalents of carboxyl group [or the ratio of number of equivalents of epoxy group/number of equivalents of phenolic hydroxyl group] is in the range of 0.8 to 3.3.

17. A composition according to claim [12] *1*, wherein said esterification product [or etherification product] is the complete esterification product [or complete etherification product] obtained by causing said novolak type epoxy compound and [said unsaturated monocarboxylic acid or unsaturated phenol compound] *acrylic acid or methacrylic acid* to react with each other in relative amounts such that the ratio of number of equivalents of epoxy group/number of equivalents of carboxyl group [or the ratio of number of equivalents of epoxy group/number of equivalents of phenolic hydroxy group] is in the range of 0.9 to 1.1.

18. A composition according to claim [12] *1*, wherein said photosensitive prepolymer is a reaction product obtained by causing said esterification product [or etherification product] and said saturated or unsaturated polybasic acid anhydride to react with each other in relative amounts such that the ratio of number of equivalents of acid anhydride to number of equivalents of the secondary hydroxyl group of said esterification product [or etherification product] is not less than 0.3, and an acid value of the produced resin is in the range of 30 to 160 mg KOH/g, preferably 45 to 120 mg KOH/g and the residual ratio of epoxy group is not more than 20%.

19. A composition according to claim [12] *1*, wherein said photosensitive prepolymer is a reaction product obtained by first causing a diisocyanate and a (meth)acrylate possessing one hydroxyl group in the molecular unit thereof to react with each other in an equimolar ratio thereby producing a half urethane (meth)acrylate and then causing said half urethane (meth)acrylate to react with the secondary hydroxyl group of said esterification product [or etherification product] in relative amounts such that the ratio of number of equivalents of isocyanate group of said half urethane (meth)acrylate to number of equivalents of said secondary hydroxyl group possessed by said esterification product [or etherification product] is in the range of 0.1 to 1.0.

24. A method of forming a solder resist pattern on a printed circuit board, which comprises applying on the surface of said printed circuit board a photosensitive thermosetting resin composition comprising (A) a photosensitive prepolymer containing at least two ethylenically unsaturated bonds in the molecular unit [threof] *thereof*, (B) a photopolymerization initiator, (C) a photopolymerizable vinyl monomer and/or an organic solvent, as a diluent, (D) a finely powdered epoxy compound containing at least two epoxy groups in the molecular unit thereof and exhibiting sparing solubility in the diluent to be used, *said photosensitive prepolymer (A) being at least one photosensitive prepolymer selected from the group consisting of complete esterification products or partial esterification products formed by the esterification of a novolak type epoxy compound with acrylic acid or methacrylic acid; reaction products obtained by causing the secondary hydroxyl group of the esterification product resulting from said esterification to react with a saturated or unsaturated polybasic acid anhydride; reaction products obtained by causing the reaction product of diisocyanate and a (meth)acrylate possessing one hydroxyl group in the molecular unit thereof to react with the secondary hydroxyl* group of said esterification product; and allyl compounds such as diallyl phthalate prepolymers and diallyl isophthalate prepolymers, and said finely powdered epoxy compound (D) being at least one epoxy resin in the form of solid or semisolid at ambient temperature selected from the group consisting of diglycidyl phthalate resin, heterocylic epoxy resin, bixylenol type epoxy resin, and biphenyl type epoxy resin, and optionally (E) a curing agent, for epoxy resin, exposing the applied layer of said composition selectively to an actinic ray through a photomask having a given pattern, developing the unexposed portion of the applied layer with a developing solution thereby giving rise to a resist pattern, and thereafter thermosetting said finely powdered epoxy compound by application of heat.

* * * * *